(12) United States Patent
Maluf et al.

(10) Patent No.: US 7,924,182 B2
(45) Date of Patent: Apr. 12, 2011

(54) TYPELESS REPRESENTATION OF ALPHANUMERIC SYMBOLS

(75) Inventors: David A. Maluf, Mountain View, CA (US); John F. Schipper, Palo Alto, CA (US)

(73) Assignee: Cap Epsilon, Inc., Los Altos, CA (US)

( * ) Notice: Subject to any disclaimer, the term of this patent is extended or adjusted under 35 U.S.C. 154(b) by 1014 days.

(21) Appl. No.: 11/680,786

(22) Filed: Mar. 1, 2007

(65) Prior Publication Data

US 2008/0018507 A1    Jan. 24, 2008

Related U.S. Application Data

(60) Provisional application No. 60/820,081, filed on Jul. 21, 2006.

(51) Int. Cl.
*H03M 7/00* (2006.01)
(52) U.S. Cl. ............................. 341/82; 341/83
(58) Field of Classification Search .................. 341/55, 341/82, 83, 90; 707/752, 755, 756
See application file for complete search history.

(56) References Cited

U.S. PATENT DOCUMENTS

| | | | | |
|---|---|---|---|---|
| 4,645,916 A * | 2/1987 | Raisleger | .................. | 341/90 |
| 5,337,233 A * | 8/1994 | Hofert et al. | .................. | 715/234 |
| 5,659,737 A * | 8/1997 | Matsuda | .................. | 707/758 |
| 6,092,193 A * | 7/2000 | Loomis et al. | .................. | 713/193 |
| 7,529,769 B1 * | 5/2009 | Maluf | .................. | 707/999.1 |
| 7,773,000 B1 * | 8/2010 | Schneider | .................. | 341/55 |

* cited by examiner

*Primary Examiner* — Howard Williams
(74) *Attorney, Agent, or Firm* — Zilka-Kotab, PC

(57) ABSTRACT

Method and system for representing a strong of alpha characters, numeral characters and/or delimiters that allows uniform searching procedures, whether or not numerals and/or delimiters are present in the string. Numerical sub strings, containing only numerals and delimiters, are re characterized in binary format and are separated from, and later recombined with, sub strings containing only alpha characters and delimiters, to provide a modified searchable string in binary format Floating point numbers are easily handled in this approach. Delimiters may be any subset of ASCII characters, as distinguished from numerals and from alpha characters. A numeral character, to be transmitted as a sequence of bits, is optimized by expression in a base (power of 2) requiring the smallest bit count.

11 Claims, 6 Drawing Sheets

From step 34

Where the magnitude of S can be expressed in the format M1(S), with base exponent p, and in the format M2(S), with base exponent p+1, and m and r do not simultaneously satisfy m=0,...,p-1 and r=m,m+1,...,p-1, transmitting the magnitude of S in the format M1(S) or M2(S)

TYPELESS REPRESENTATION OF ALPHANUMERIC SYMBOLS

The present application claims priority to U.S. Provisional Application No. 60/820,081 filed Jul. 21, 2006.

FIELD OF THE INVENTION

This invention relates to representation of alphanumeric symbols and phrases by a uniform statement of modified ASCII characters, and to numerical value storage, retrieval, searching and transport of character representatives.

BACKGROUND OF THE INVENTION

Full text search engines, commonly used for indexing and searching sets of documents such as web pages on the Internet, index "strings" of alphanumeric characters (usually whole words or strings of characters between delimiters such as white space and punctuation.) Numeric information such as measurements (height, mass, length, temperature), monetary values, and other information is indexed in such search engines as their string representation and searching for such values is performed on a character-by-character basis. For example, although the numeric value of 01.23 and 1.230 are equivalent (although the notation may be indicative of measurement precision), searching for one string will not return the other string. Additionally, when the values 1, 2 and 15 are indexed as strings, 15 is sorted between 1 and 2: the first numeral of "15" is less than "2"; and the total numeral value of "15" is greater than "1". Searching for data in numeric order, searching for numeric values between a lower and upper bound, and other operations in such an index are impossible, where a fixed width index is imposed.

What is needed is a system to represent all ASCII characters by a modified set of such characters in which no distinction is made, within the representation itself, between representation of a numerical value, with or without delimiters such as decimal points and commas, and a non-numerical expression: and in which a numerical value such as "15" is automatically assigned a location such that "2" lies between "1" and "15".

SUMMARY OF THE INVENTION

These needs are met by the invention, which provides a modified ASCII set in which no distinction is made in processing between an alphanumeric or numerical character, with or without one or more special delimiters included, and a non-numerical character, such as an alphabetical character or punctuation mark (referred to collectively as an "alpha character"); an "alpha character" includes all characters that are not numerals. Herein, a "delimiter" refers to nay of M delimiters ($M \geq 1$), such as "." or "," or "("or")" or "+" or "−" or "bs" (blank space), that are incorporated in an alphanumeric or numerical string; a delimiter can also belong to a set of alpha characters, but is referred to as a "delimiter" when included in a string of numerals 0, 1, . . . , 9 (referred to as a "numeral string").

When a character string is specified, each alpha character is represented by its ASCII number, expressed in binary format. Thus, a standard alpha character is represented by a 7-bit segment (standard ASCII representation, which is used here) or by an 8-bit segment (extended ASCII representation). A consecutive string of numerals and associated delimiters (referred to herein as a "numerical string"), with no other characters present, is represented by up to five consecutive seven-bit binary strings (for 32 bit representation), by up to seven consecutive seven-bit binary strings (for 48 bit representation), and by up to ten consecutive seven-bit binary strings (for 64 bit representation), with the bit string representing (i) numerals, (ii) each delimiter present and (iii) the location of each delimiter present in the numerical string.

Each alpha character in an "alpha string" (containing only alpha characters) is represented by the associated ASCII character. For example, the characters "eot" (end of text) and lower case "u" are represented by the ASCII numbers 003 and 117 (in decimal representation), respectively, and by 0000011 and 1110101 (in 7-bit binary representation), respectively. A decimal number 497 is represented in decimal format and in seven-bit binary formats as $$(497)_{dec} = \{256 + 128 + 64 + 32 + 16 + 01\}_{dec} \quad (1)$$
$$= \{2^9 + 2^8 + 2^7 2^5 + 2^4 + 2^0\}_{binary}$$
$$= \{000011 / 1110001\}_{binary},$$

where the seven-bit configurations having the three higher value seven-bit values are omitted here for convenience.

In order to address these limitations, this invention converts each numerical sub-string, including only numerals and delimiters, into its integer or floating point value in memory. This is usually a 32-bit or 64-bit integer or 32-bit or 64-bit floating point value, depending upon the requirement, and high-order bits are preferably stored first so that the binary representations of the numbers can be sorted. This binary representation is then stored as an index in this format. Depending on the capability of the underlying index, the binary representation of the number may need to be converted to a standard or custom 5-bit (base 32) or 6 bit (base 64) or 7-bit (base 128) string so that index string terminators and similar special characters are avoided. A numerical value with fractional components may be represented by two such integer conversions, but this value will not be sorted correctly if treated as a fractional value. For example, 1.23 should sort later than 1.0045, if these strings represent floating point values). Other complex number series, such as ISBN book publisher numbers or 12-decimal IP addresses, may be better encoded using integer encoding.

Searching requires converting an alphanumeric string in a search term to its encoded equivalent and searching based on that equivalent. Searching based on numerical values in a string can then be based on the integer values without concerns for certain non-essential "0" numerals. Because the numerical values are stored in most significant-byte first order, higher numerical values will be sorted correctly when converted to their encoded representations and may be quickly searched for and compared against, in relational operations. For example, searching for text that contains the word "temperature" and for a value between "20.0" and "22.2" will be able to leverage the numerical indexing to find documents that meet those criteria in an efficient manner.

At least two objects are accomplished by the invention: (1) reduce the size of, and provide uniformity for, a representation of all alpha characters and all numeric characters in a string; and (2) provide an optimum representation for transmission of any alphanumeric string of characters.

DESCRIPTION OF BEST MODE OF THE INVENTION

As an example of operation of the invention, consider a representation of the 14-character string $$S0=Ab4,97.21-\text{kge}, \quad (1)$$

The first two alpha characters ("Ab") correspond to standard ASCII decimal numbers 65 and 98, and the last five alpha characters "-kge,") correspond to numbers 45, 107, 103, 101 and 44; optionally, the delimiter "-" after the numeral "1" could be (but is not here) added to the numerical string, NS=4,97.21, in the string S0, which includes the delimiters "," and "." and "-".

Figure 1A:
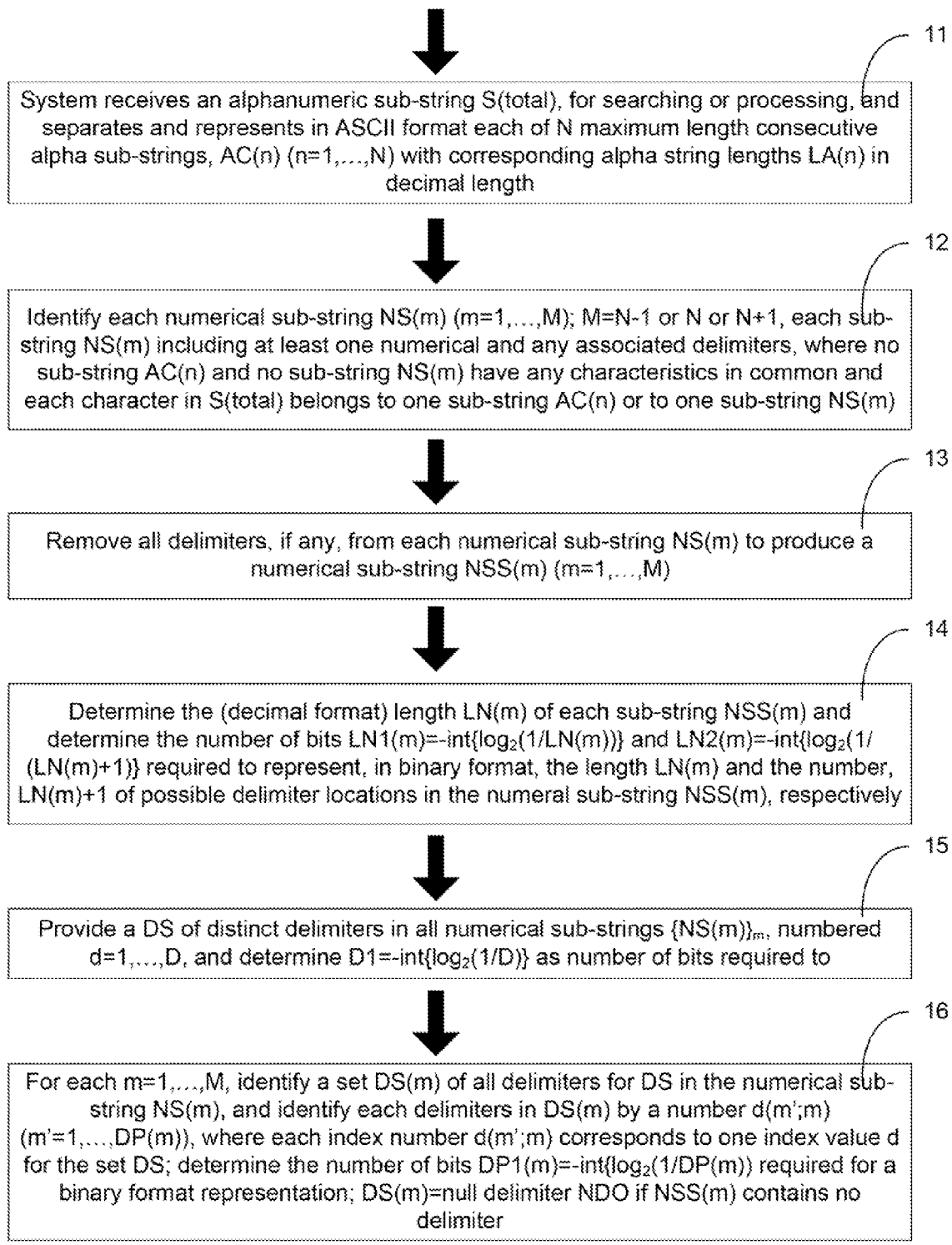
FIGS. 1 and 2 are flow charts of alternative procedures for practicing an embodiment of the invention.
Figure 1B:
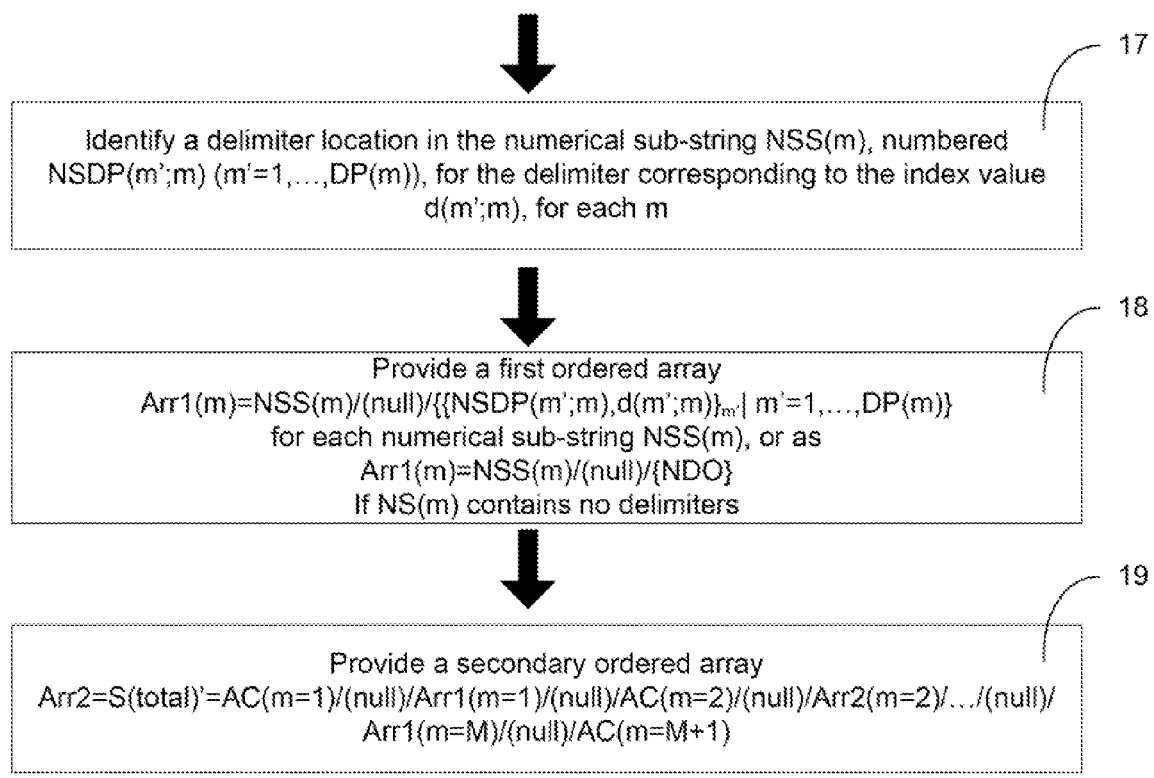
Figure 2A:
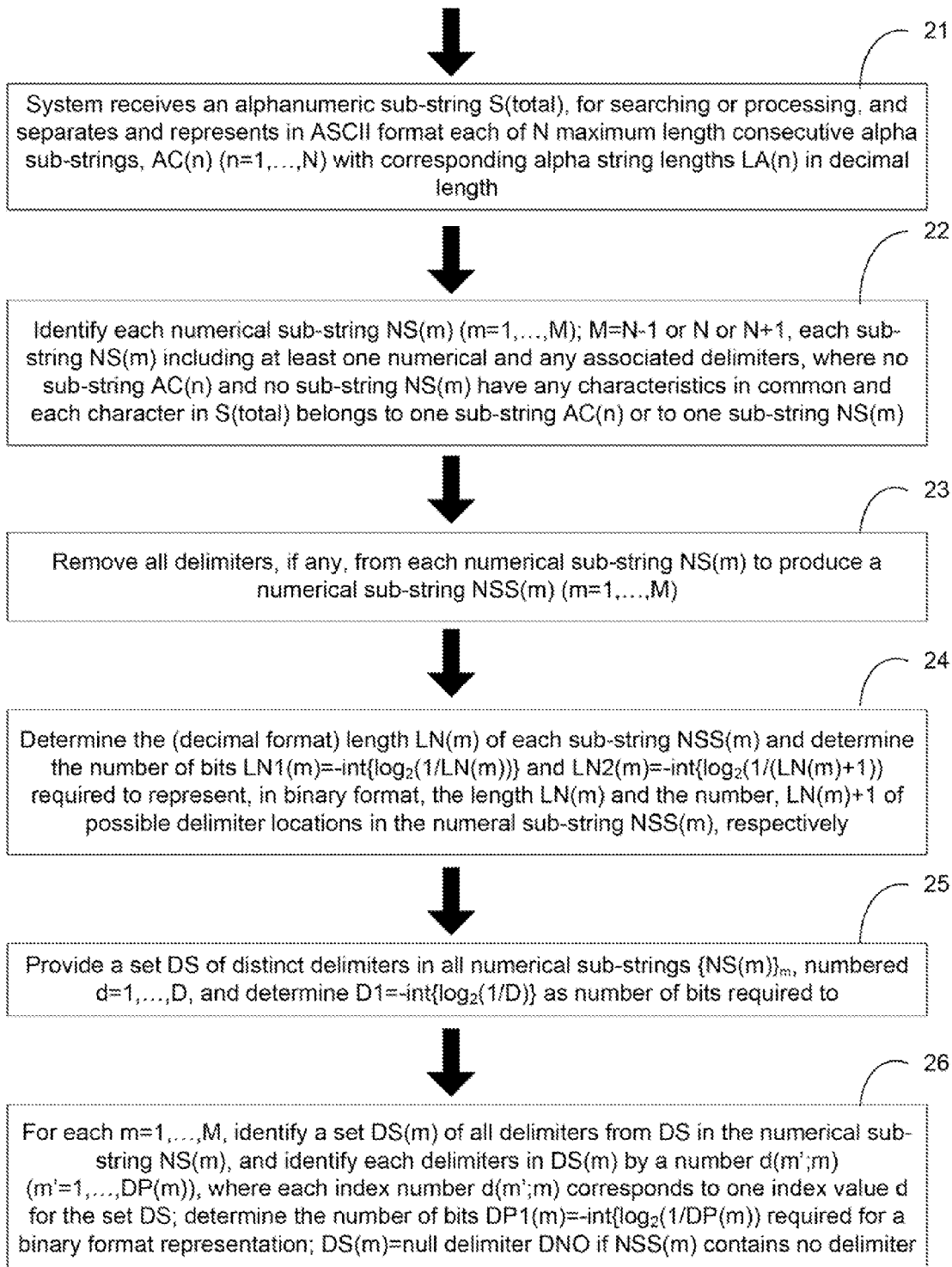
Figure 2B:
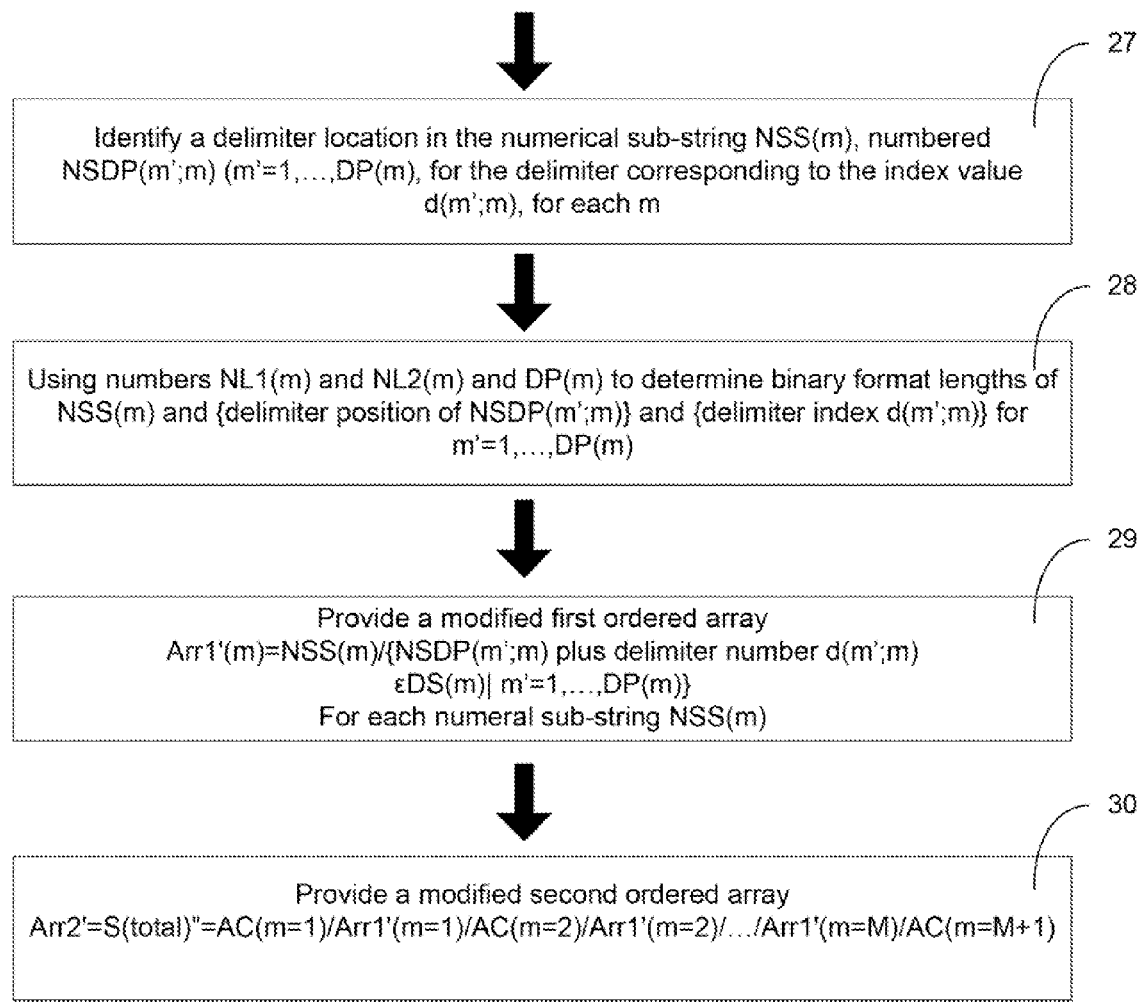

FIG. 1 is a flow chart of a procedure, implementable by a computer that is appropriately programmed, to provide a uniform representation of an alphanumeric string S(total), applied by way of example to S0. In step 11, the system receives an alphanumeric string S(total), including alpha characters, numeral characters and/or delimiters (for searching or other processing) and separates and represents in ASCII format each of N maximum length consecutive alpha character sub-strings, represented as AC(n) (n=1, . . . . N; N≧1) in binary format, with corresponding alpha character sub-string length LA(n) in decimal format. In step 12, the system identifies each numerical sub-string NS(m), including at least one numeral and associated delimiters, in S(total), where no maximum length alpha character sub-string AC(n) and no numerical sub-string NS(m) have any characters in common. For the example S=S0, this would be "Ab" {65; 98} and "-kge." {45; 107; 103; 101; 44}, with N=2. In step 12, all delimiters ("," and "." for S0), if any within each numerical sub-string NS(m) are removed to produce an ordered sequence of M numeral sub-strings NSS(m), numbered m=1, . . . . M and containing only numerals (NSS(m=1)=49721 for the example S0, with M=1), separated from each other by at least one alpha character. Generally, M=N−1 or N or N+1. In step 14, the length LN(m) of each numeral sub-string NSS(m) is determined, and the numbers of bits $$LN1(m) = \min\{n|(LN(m))/2^n \le 1\} \quad (3A)$$
$$= \min\{n|2^{nl}/(LN(m)) \ge 1\}$$
$$= -int\{\log_2(1/LN(m))\},$$

$$LN2(m) = \min\{n|(LN(m)+1)/2^n \le 1\} \quad (3B)$$
$$= \min\{n|2^{nl}/(LN(m)+1) \ge 1\}$$
$$= -int\{\log_2(1/(LN(m)+1))\},$$

required to represent the number LN(m) of numerals in NSS(m) and the number LN(m)+1 of delimiter locations in NSS(m) in binary format, respectively, are determined, where int(K) is the largest integer ≦ the real number K.

A null delimiter ND0, indicating that no (other) delimiter is present in the numerical sub-string NS(m), may be represented as a longer than-normal string of Q consecutive binary zeroes or binary ones, where Q is to be determined by other considerations.

In step 15, a set of different delimiters in the set {NS(m)}$_m$ of numerical sub strings, with each different delimiter indexed d=1, . . . , D, and $$D1=-int\{\log_2(1/D)\} \quad (4)$$

being the number of bits required to represent the number D in binary format. One may choose Q=D1 +q (q≧1).

In step 16, for each m=1, . . . , M, a set DS(m) of all delimiters from DS in the numerical sub-string NS(m) is identified by a delimiter index, d(m';m) (m'=1, . . . , DP(m); d(m';m)=d=1, . . . , D) that corresponds to one index value d for the set DS, where DP(m) is the number of (not necessarily distinct) delimiters from the set DS(m), for each m, and the number of bits $$DP1(m)=-int\{\log_2(1/DP(m))\}. \quad (5)$$

required for binary format representation is optionally computed. Where no delimiter occurs in NS(m) for a particular m, the set DS(m) contains only the distinctive null delimiter ND0.

In step 17, a numerical position or location in the numeral sub-string NSS(m), numbered NSDP(m';m) (m'=1, . . . , DP(m)), for the delimiter corresponding to the index value d(m';m), is identified, for each m. Where DS(m) contains only ND0, {NSDP(m';m)}$_m$ is an empty set. The pair {NDSP}(m'; m), d(m'; m)} refers to a particular location NDSP(m';m) within the numerical sub-string NSS(m) and to the corresponding delimiter in DS(m), having the index value d(m';m) and positioned at this location. Alternatively, NDSP(m';m) can be replaced by ANDSP(m';m)=NDSP(m';m)−NDSP(m'−1;m), the distance from one delimiter location to the next location. The pair {NSDP(m';m), d(m';m)} is represented in binary format as LN2(m)+D1 bits, independent of the value of m'.

In step 18, the system provides a first ordered array $$Arr1(m)=NSS(m)/(null)/\{\{NSDP(m';m),\,d(m';m)\}1\,m'=1,\ldots DP(m)\}, \quad (6)$$

for each numeral sub-string NSS(m), where the first ordered array for one or more values m consists of only NSS(m)/(null)/ND0, when no delimiter occurs within the numerical sub-string NS(m). Here, (null) is a distinguishable group of zeroes and/or ones in binary format. The first ordered array Arr1(m) is represented as $$L\{Arr1(m)\}=LN1(m)+\{LN2(m)+D1\}\cdot DP(m)+(null) \quad (7)$$

bits, in binary format.

In step 19, the system represents S(total) as a second ordered array $$Arr2=S(total)'=AC(m=1)/(null)/Arr1(m=1)/(null)/\,AC(m=2)/(null)\,\,Arr2(m=2)/\,\ldots\,/(null)/\,Arr1(m=M)/(null)/AC(m=M+1). \quad (8)$$

If an alpha character string, such as AC(m=1) and/or AC(m=M+1), is not present in the representation of S(total), this string is also absent in the representation S(total)'. The total binary length of the modified string S(total)' is $$L\{Arr2\}=\Sigma_m\{L\{AC(m)+LN1(m)+\{LN2(m)+D1\}\cdot DP(m)+(null\,bits)\} \quad (9)$$

The result is a modified binary format string S(total), in which alpha characters, numerals and delimiters that are part of an modify the numeral sub-string(s) are presented in modified binary format and are processed substantially uniformly in a search for the total string S(total), after the numerical sub-string delimiters and their respective locations are identified. Appendix 1 illustrates application of the invention to an example, S(total)=S0.

In an alternative approach, steps 18-19 are replaced by steps 28, 29 and 30, with steps 21-26 being the same as steps 11-16, respectively. In step 28, the numbers LN1(m) and LN2(m) and DP1(m) are used to determine the number of bits in each of the expressions NSS(m) and {delimiter position NSDP(m';m)} and {delimiter index d(m';m)} for m'=1, ..., DP(m). In step 29, a modified array $$Arr1'(m) = NSS(m) / \{NSDP(m';m) \text{ plus delimiter no. } d(m';m) \epsilon DS(m)1 \; m'=1, \ldots, DP(m)\}, \text{ for each numeral sub-string } NSS(m), \quad (10)$$

where the first ordered array for one or more values m consists of only the null delimiter ND0 when no delimiter occurs within the numerical sub-string ND(m). In the modified first array Arr1'(m), no binary string representing a "null" occurs because the numbers of binary positions for each of the components in this array are known. This approach reduces the binary size from that required for Arr1(m), at a cost of requiring determination and storage elsewhere of the bit sizes of the individual components. In step 30, the system represents S(total) as a modified second ordered array $$Arr2' = S(total)'' = AC(m=1)/Arr1'(m=1)/AC(m=2)/Arr1'(m=2)/ \ldots /Arr1'(m=M)/AC(m=M+1). \quad (11)$$

A floating point representation of a number is a special case of this general representation, with m=M=1 delimiter present and the particular delimiter being "." or "," depending upon what symbol is used to represent the decimal point, or the null delimiter ND0.

Optimal Transport of Binary Format Numbers

When a numeral string S is transmitted, the binary base is to be used (e.g., base $2^p=32$ (p=5) or base $2^p=64$ (p=6) or base $2^p=128$ (p=7) or base $2^p=256$ (p=8)) can be optimized to minimize the bit count needed to specify the string. Surprisingly, the optimum base may change, depending upon the magnitude M(S) of the string S. Consider a numerical string S, consisting of a string of numerals plus a signum bit (±) plus, optionally, one or more delimiters, such as a decimal point for floating point format. The signum bit and the bits representing a delimiter, if any, will not change, no matter what base is used here so that, in any comparison, the presence of these bits can be ignored. Assume that the numeral string S (without delimiters), expressed in decimal format, satisfies $$2^{b1} \le M(S) < 2^{b1,1}, \quad (12)$$

$$b1 + 1 = \min\{n | M(S)/2^n \le 1\} \quad (13)$$
$$= \min\{n | 2^n / M(S) \le 1\}$$
$$= -int\{\log_2(1/M(S))\},$$

where int{K} is largest integer (positive, negative or zero) that is ≤K and the magnitude exponent b1 may be positive, negative or zero. Express the numeral string S in binary format in two alternative forms, as $$S = 2^{b1} f_1(S) = 2^{b1} \{1, a_1 a_2 \ldots, a_N\}, \quad (14A)$$

$$S = 2^{b1+1} f_2(S) = 2^{b1+1} \{0, 1 \; a'_1 a'_2 \ldots, a'_N\}. \quad (14B)$$

where the fractional functions $f_1(S)$ and $f_2(S)$ are expressed in binary format and satisfy $1 \le f_1(S) < 2$ and $0.5 \le f_2(S) < 1$ and $f_2(S) = 0.5 f_1(S)$ (optional), and the numeral $a_n = a'_{n-1}(n=2, \ldots N)$ is either 0 or 1 and is the bit coefficient for the value $2^{-n}$ (for $f_1(S)$) or the bit coefficient for $2^{(m+1)}$ (for $f_2(S)$). The coefficient $a_N$, with N dependent upon the string S is the last non zero bit coefficient in the binary expression for $f_1(S)$ so that $$a_{n'} = 0 \text{ for } n' = N+1, N+2, \quad (15)$$

Consider expression of S in a base $B = 2^{b1} = 32$, and let E(b1;base 32) represent the exponent of the base (a power of $2^5 = 32$) required to represent the numeral string S as in Eq.

(14A) Table 1 sets forth the exponent E(b1;base $2^b$), with b=5, 6, 7 or 8) for each of a sequence of numeral bases b1

The two columns corresponding to base B1=32 and to base B1=64 have the same exponent E(b1;base B1) for b1=00, 01, 02, 03, 04 (E=0); have the same exponent E(b1;base B1) for b1=06, 07, 08, 09 (E=1); have the same exponent E(b1;base B1) for b1=12, 13, 14 (E=2); have the same exponent E(b1;base B1) for b1=18, 19 (E=3); and have the same exponent E(*b1;base B1) for b1=24 (E=4).

The two columns corresponding to base B2=64 and to base B2=128 have the same exponent E(b1;base B2) for b1=00, 01, 02, 03, 04, 05 (E=0); have the same exponent E(b1;base B2) for b1=07, 08, 09, 10, 11 (E=1); have the same exponent E(b1;base B2) for b1=14, 15, 16, 17 (E=2); have the same exponent E(b1;base B2) for b1=21, 22, 23 (E=3); have the same exponent E(b1;base B2) for b1=28, 29 (E=4); and have the same exponent E(b1;base B2) for b1=35 (E=5).

The two columns for base B3=128 and base B3=256; have the same exponent E(b1;base B3) for b1=00, 01, 02, 03, 04, 05, 06 (E=0); have the same exponent E(b1;base B3) for b1=08, 09, 10, 11, 12, 13 (E=1); have the same exponent E(b1;base B3) for b1=16, 17, 18, 19, 20 (E=2); have the same exponent E(b1;base B3) for b1=24, 25, 26, 27 (E=3); have the same exponent E(b1;base B3) for b1=32, 33, 34 (E=4); have the same exponent E(b1;base B3) for b1=40, 41 (E=5); and have the same exponent R(b1;base B3) for b1=48.

Conventionally, the base exponents number p=5, 6, 7 and 8 are expressed in binary format as the ordered sequences (1,0, 1), (1,1,0), 1,1,1,) and (1,1,1,1), respectively. However, by adopting a different numbering convention, such as {p}={5, 6, 7, 8}<-≧{(1,0,0), (1,0,1), (1,1,0), (1,1,1)}, or as {p}={5, 6, 7, 8}<-≧{(0,0), (0,1), (1,0), (1,1)}, all base exponents can be specified using the same number of bits here (2 or 3); this modified convention is adopted here, to simplify the comparisons of numbers of bits required. Where a standard convention is used, requiring three and four bits to express base exponents p, comparison of bases 128 and 256 will favor the smaller base for all values of b1.

Consider, as an example, the grouping corresponding to base $B1 = 2^p = 32$ (p=5) and base $B1 = 2^{p=64}$ (p=6) for b1=06, 07, 08, 09, with exponent E=1. With reference to Eqs. (14A) and (14B), the fractional functions $f_1(S)$ and $f_2(S)$ require N+1 bit coefficients and N+2 bit coefficients, respectively, to express (not including the signum bit and the delimiter bits, which are the same for each choice of base). Using the modified base exponent numbering convention of the preceding paragraph, specification of each base B1 requires the same number of bit coefficients (e.g., 2 or 3 in the preceding example). The total bit count for a number with E=1 and b1=06, 07, 08, 09 is thus N+3 and N+4 for the respective bases B1=32 and B1=64. The base B1=32 for b1=06, 07, 08, 09 and exponent E=1 can be expressed with (at least) one fewer bit coefficients than the base B1=64. In transmission of a numeral string S, expressible as in Eqs. (14A) and (14B), with b1=06, 07, 08 or 09, the choice of base B1=32 (Eq. (14A)) is preferred over the choice of base B1=64 (Eq. (14B)) for some magnitude exponents b1, because (at least) one fewer bit coefficient is required for the choice of Eq. (14A). This choice of the smaller of the two bases is preferred for each of the following base pairs:

b1=00, 01, 02, 03, 04 base 32 and base 64
b1=06, 07, 08, 09 base 32 and base 64
b1=12, 13, 14 base 32 and base 64
b1=18, 19 base 32 and base 64
b1=24 base 32 and base 64
b1=00, 01, 02, 03, 04, 05 base 64 and base 128
b1=07, 08, 09, 10, 11 base 64 and base 128 b1=14, 15, 16, 17 base 64 and base 128
b1=21, 22, 23 base 64 and base 128
b1=28, 29 base 64 and base 128
b1=35 base 64 and base 128
b1=00, 01, 02, 03, 04, 05, 06 base 128 and base 256
b1=08, 09, 10, 11, 12, 13 base 128 and base 256
b1=16, 17, 18, 19, 20 base 128 and base 256
b1=24, 25, 26, 27 base 128 and base 256
b1=32, 33, 34 base 128 and base 256
b1=40, 41 base 128 and base 256
b1=48 base 128 and base 256

With all other magnitude exponents in a range b1=00-50, the larger of the bases (32 vs. 64 vs. 128 vs. 256) is often preferred, but either base can be used.

The optimal choice of (smaller) base for each of the situations set forth in the preceding list can be expressed in a single algorithm. Where the bases $B=2^p$ and $B=2^{p+1}$ (p=5, 6, 7) are considered for transmission of a numeral string S, the smaller base, $B=2^p$, should be used for a magnitude M(S) of the string S expressible as $2^{b1}f(S)$, where $1 \leq f(S) < 2$, where b1 is an integer satisfying $$b1 = m'p + r, \text{ with } r = m, m+1, \ldots, p-1 (m=0, 1, \ldots, p-1) \quad (16)$$

Thus, the optimal base chosen (32, 64, 128, 256), which allows expression of the numeral string S in the smallest number of bits, will vary with the magnitude of the numeral and with the exponent b1 required to express the numeral. In many instances, the optimal base will allow expression of the numeral with one or two fewer bits than will any other choice of base, expressed as a power of 2.

Figure 3A:
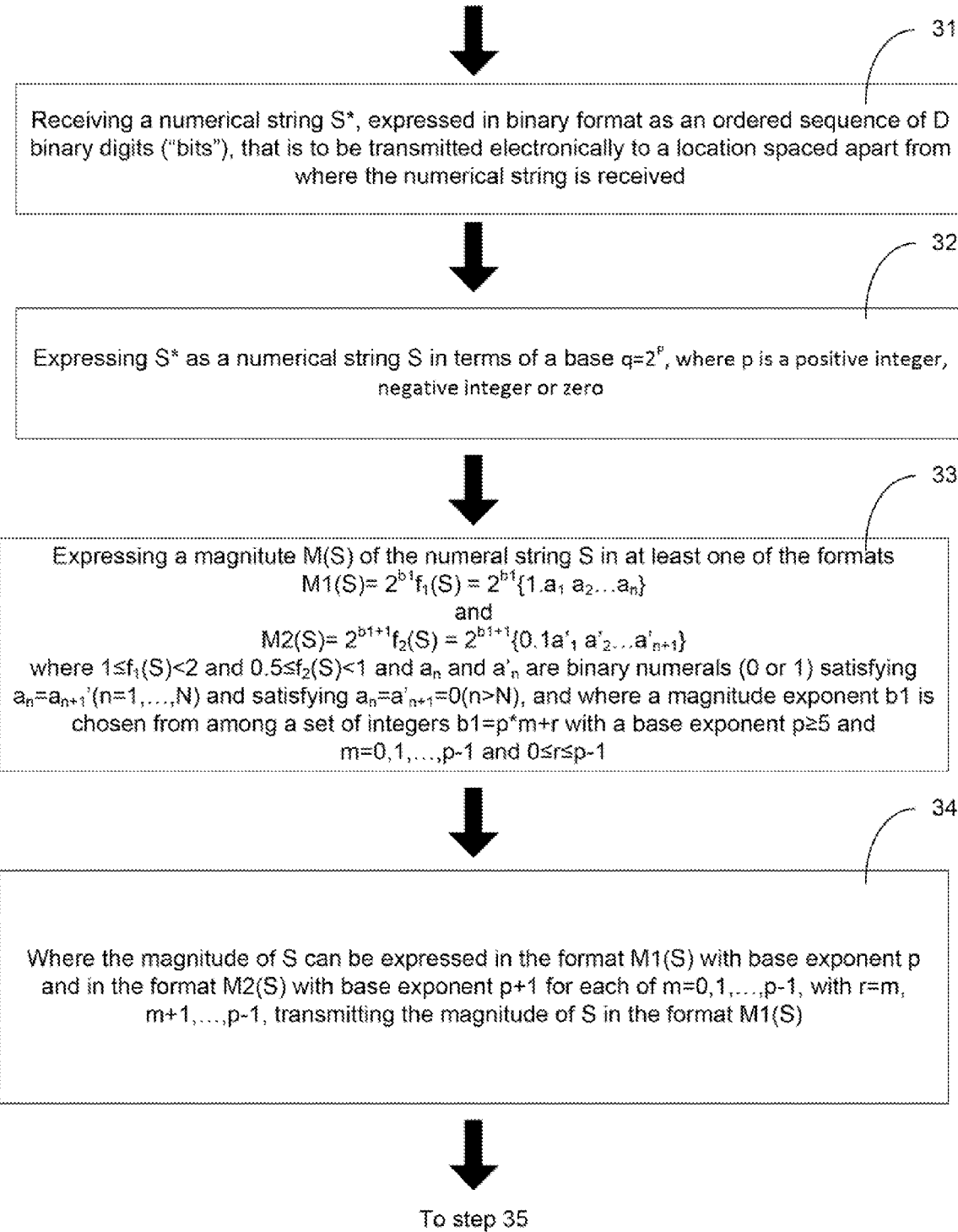
FIG. 3 is a flow chart for another procedure to practice the invention.
Figure 3B:

FIG. 3 is a flow chart of a procedure for practicing this embodiment of the invention. A system is provided with a computer programmed to perform the following. In step 31, the system receives a numeral string S*, expressed in binary format as an ordered sequence of D binary digits ("bits"), that is to be transmitted electronically to a location spaced apart from where the numeral string is received. In step 32, S* is expressed as a numeral string S in terms of a base $q=2^p$, where p is a positive integer, a negative integer or zero. In step 33, a magnitude M(S) of the numeral string S is expressed in at least one of the formats $$M1(S) = 2^{b1} f_1(S) = 2^{b1} \{1, a_1 a_2 \ldots, a_N\}.$$

and $$M2(S) = 2^{b1+1} f_2(S) = 2^{b1+1} \{0.1 \, a'_1 a'_2 \ldots, a'_{N+1}\}.$$

where $1 \leq f_1(S) < 2$ and $0.5 \leq f_2(S) < 1$, and $a_n$ and $a'_n$ are binary numerals (0 or 1) satisfying $a_n = a'_{n+1}$ (n=1, ..., N), and satisfying $a_n = a'_{n+1} = 0$ (n≥N), and where a magnitude exponent b1 is chosen from among a set of integers including b1=p·m+r, with a base exponent $p \geq 5$ and m=0, 1, 2, 3, 4, ..., p−1 and $0 \leq r \leq p-1$. In step 34, where the magnitude of S can be expressed in the format M1(S), with base exponent p, and in the format M2(S), with base exponent p+1, for each of m=0, ..., p−1 and r=m, m+1, ... p·1, the magnitude of S is transmitted in the format M1(S). This is a first subset of possible combinations of r and m. In step 35, where the magnitude of S can be expressed in the format M1(S), with base exponent p, and in the format M2(S), with the base exponent p+1, and m and r do not simultaneously satisfy m=0, ..., p−1 and r=m, m+1 ..., p·1, the magnitude of S is transmitted in the format M1(S) or M2(S). This is a subset including the remaining combinations of r and m.

Where a numeral string S1 is received in decimal format (using numerals 0, 1, ..., 9), rather than binary format (using numerals 0 and 1), as an ordered sequence of D* (decimal) digits, the computer may be further programmed:

to convert the numeral string S1 to a binary format numeral S2, where S2 is expressed as an ordered sequence of D bits, and where $D = -\text{int}\{\log_2(1/D^*)\}$; and to provide S2 as the numeral string S*, expressed in binary format.

This embodiment is illustrated for base exponents p=5, 6, 7 and 8 but can be expanded to lower values or higher values of the base exponent p ($2 \leq p \leq 4$ and/or $p \geq 9$) by analogy with the present analysis.

TABLE 1

| | Exponent required to represent numeral string S. | | | |
|---|---|---|---|---|
| b1 | E(b1: base 32) | E(b1: base 64) | E(b1: base 128) | E(b1: base 256) |
| 00 | 0 | 0 | 0 | 0 |
| 01 | 0 | 0 | 0 | 0 |
| 02 | 0 | 0 | 0 | 0 |
| 03 | 0 | 0 | 0 | 0 |
| 04 | 0 | 0 | 0 | 0 |
| 05 | 1 | 0 | 0 | 0 |
| 06 | 1 | 1 | 0 | 0 |
| 07 | 1 | 1 | 1 | 0 |
| 08 | 1 | 1 | 1 | 1 |
| 09 | 1 | 1 | 1 | 1 |
| 10 | 2 | 1 | 1 | 1 |
| 11 | 2 | 1 | 1 | 1 |
| 12 | 2 | 2 | 1 | 1 |
| 13 | 2 | 2 | 1 | 1 |
| 14 | 2 | 2 | 2 | 1 |
| 15 | 3 | 2 | 2 | 1 |
| 16 | 3 | 2 | 2 | 2 |
| 17 | 3 | 2 | 2 | 2 |
| 18 | 3 | 3 | 2 | 2 |
| 19 | 3 | 3 | 2 | 2 |
| 20 | 4 | 3 | 2 | 2 |
| 21 | 4 | 3 | 3 | 2 |
| 22 | 4 | 3 | 3 | 2 |
| 23 | 4 | 3 | 3 | 2 |
| 24 | 4 | 4 | 3 | 3 |
| 25 | 5 | 4 | 3 | 3 |
| 26 | 5 | 4 | 3 | 3 |
| 27 | 5 | 4 | 3 | 3 |
| 28 | 5 | 4 | 4 | 3 |
| 29 | 5 | 4 | 4 | 3 |
| 30 | 6 | 5 | 4 | 3 |
| 31 | 6 | 5 | 4 | 3 |
| 32 | 6 | 5 | 4 | 4 |
| 33 | 6 | 5 | 4 | 4 |
| 34 | 6 | 5 | 4 | 4 |
| 35 | 7 | 5 | 5 | 4 |
| 36 | 7 | 6 | 5 | 4 |
| 37 | 7 | 6 | 5 | 4 |
| 38 | 7 | 6 | 5 | 4 |
| 39 | 7 | 6 | 5 | 4 |
| 40 | 8 | 6 | 5 | 5 |
| 41 | 8 | 6 | 5 | 5 |
| 42 | 8 | 7 | 6 | 5 |
| 43 | 8 | 7 | 6 | 5 |
| 44 | 8 | 7 | 6 | 5 |
| 45 | 9 | 7 | 6 | 5 |
| 46 | 9 | 7 | 6 | 5 |
| 47 | 9 | 7 | 6 | 5 |
| 48 | 9 | 8 | 6 | 6 |
| 49 | 9 | 8 | 7 | 6 |
| 50 | 10 | 8 | 7 | 6 |

Appendix 1. Re-expression of S0 According To Invention.
The 14-character string
S0Ab4,97.21, kge,
is decomposed into the following binary components in 7-bit ASCII format:
AC(m=1)=Ab=1000001/1100010,
AC(m=2)=kge, =0101101/1101011/1100111/0101100/0101100, NS(m=1)=4,97.21==0110100/0101100/0111001/
    0110111/0101110/0110010/0110001,
NSS(m=1)=4,97.21=0110100/0111001/0110111/
    0110010/0110001,
where a slash (/) indicates a break between a successive string characters, expressed in ASCII format. Other relevant parameters for S0 are:

M=1,
NL(m=1)=5,
NL1(m=1)=NL2(m=1)=3,
DS={, .}
D=2,
D1=1,
DP(m=1)=2,
DP1(m=1)=1,
NSDP(m'=1;m=1)=2(decimal)=010(binary), d(m'=1; m=1)=0,
NSDP(m'=2;m=1)=4(decimal)=100(binary), d(m'=2; m=1)=1,
ND0=11111111 (not used here),
Arr(m=1)==0110100/0111001/0110111/0110010/
    0110001/(null)/{010 0}/(null)/{100 1},
S0(total)'=1000001/1100010/(null)/0110100/0111001/
    0110111/0110010/011001/(null)/{010 0}/(null)/{100 1}/(null)/0101101/1101011/1100111/0101100.

Note that AC(m=2) contains two delimiters, one of which also appears in NS(m=1). The total number of bits for the expression of S0(total)' is (7)(11)+(2)(3+1)+(4)(null bit length)=85+(4)(null bit length).

What is claimed is:

1. A method for representing a string S(total) of alpha characters, numeral characters and delimiters, the method comprising providing a computer that is programmed:

to receive or provide an ordered sequence of characters representing a string S(total) of characters, including at least one of an alpha character and a numeral character;

to identify and represent from S(total), in ASCII format, each maximum length sub-string of alpha characters AC(n), numbered n =1, . . . , N(N≧1), with corresponding alpha character sub-string length LA(n) in binary format;

to identify each numerical sub-string NS(m), numbered m=1, . . . , M(M≧1), within S(total) that contains only numerals and delimiters, where no alpha character sub-string AC(n) and no numerical sub-string NS(m) have any characters in common;

to identify a set DS of all distinct delimiters that appear in at least one of the numerical sub-strings NS(m) and a number of elements of the set DS;

to identify, for each m, −1, . . . , M, a set DS(m) of all delimiters belonging to DS, numbered d(m':m)(m'= 1, . . . , DP(m)), in the set {NS(m)}$_m$ of numerical sub-strings, not including a null delimiter ND0, where DP(m) is the number of delimiters that appear in the numerical sub-string NS(m), for each of m =1, . . . , M, and where the set DS(m) consists of the null delimiter ND0 when no delimiter occurs within the numerical sub-string NS(m);

to remove all delimiters from each numerical sub-string NS(m) to provide a corresponding numeral sub-string NSS(m), and to represent each numeral sub-string NSS(m), having a length LN(m) in decimal format, and having a corresponding length LN 1(m) =×int { log$_2$(1/LN(m))} in binary format, for each m;

to provide a length LN2(m)=−int { log$_2$(1/LN(m)+1))} in binary format required to represent LN(m)+1 delimiter locations in binary format, for each m;

to identify a numerical position or location, numbered NSDP(m':m)(m'=, . . . , DP(m)), in the numerical sub-string NSS(m) where a delimiter occurs, for each m;

to provide a first ordered array Arr1(m)=NSS(m)/(null)/ {{delimiter position NSDP(m':m), delimiter no. d(m'; m)}|m'=1, . . . , DP(m)}, for each numeral sub-string NSS(m), where the first ordered array for a value m consists of only the null delimiter ND0 when no delimiter occurs within the numerical sub string NS(m), for each m, and (null) is a distinguishable group of one or more characters expressed in binary format; and to represent S(total) as a second ordered array Arr2=AC (m=1)/(null)/Arr1(m=1) / (null)/AC(m=2)/(null)/Arr1 (m=2)/(null–)/. . . /(null)/Arr1(m=M)/(null)/AC(m=M+1).

2. The method of claim 1, further comprising choosing at least one of said alpha character sub-string AC(m=1) and AC(m=M+1) to be an empty set.

3. The method of claim 1, further comprising representing said first array Arr1(m) as a binary sequence of length LN1 (m)÷{LN2(m)+D1}DP1(m)+(null bits), where DP1(m)= −int{log$_2$(1/DP(m))}.

4. A method for representing a string S(total) of alpha characters, numeral characters and delimiters, the method comprising providing a computer that is programmed;

to receive or provide an ordered sequence of characters representing a string S(total) of characters, including at least one of an alpha character and a numeral character;

to identify and represent from S(total) in ASCII format, each maximum length sub string of alpha characters AC(m), numbered n=1, . . . , N(N ≧1), with corresponding alpha character sub string length LA(n) in binary format;

to identify each numerical sub string NS(m), numbered m=1 , . . . , M(M≧1), within S(total) that contains only numerals and delimiters, where no alpha character sub-string AC(n) and no numerical sub-string NS(m) have any characters in common;

to identify a set DS of all distinct delimiters that appear in at least one of the numerical sub-strings NS(m) and a number of elements of the set DS;

to identify, for each m,=1, . . . , M, a set DS(m) of all delimiters, numbered d(m';m) (m'=1, . . . , DP(m)), in the set {NS(m)}$_m$ of numerical sub strings, not including a null delimiter ND0, where DP(m) is the number of delimiters that appear in the numerical sub-string NS(m), for each of m=1, . . . , M, where the set DS(m) consists of the null delimiter ND0 when no delimiter occurs within the numerical sub-string NS(m);

to remove all delimiters from each numerical sub string NS(m) to provide a corresponding numeral sub string NSS(m), and to represent each numeral sub-string NSS (m), having a length LN(m) in decimal format, and having a corresponding length LN1(m)=−int{log$_2$(1/LN (m))} in binary format, for each m;

to provide a length LN2(m)=−int{log$_2$(1/(LN(m)+1))} in binary format required to represent LN(m)+1 delimiter locations in binary format, for each m;

to identify a numerical position or location, numbered NSDP(m'(m)(m'=1, . . . ,DP(m)), in the numeral sub string NSS(m) where a delimiter occurs, for each m;

to provide a first ordered array Arr1(m)=NSS(m)/{delimiter position NSDP(m';m) plus delimiter no. d(m';m)ϵ DS(m)|m'=1, . . . , DP(m)}, for each numeral sub string NSS(m), where the first ordered array for a value m consists of only the null delimiter ND0 when no delimiter occurs within the numerical sub string NS(m), for each m.; and to represent S(total) as a second ordered array Arr2'=AC(m=1)/Arr1'(m=1)/AC(m=2)/ Arr1'(m=2)/. . . / Arr1'(m=M)/AC(m=M+1).

5. The method of claim 4, further comprising choosing at least one of said alpha character sub-string AC(m=1) and AC(m=M+1) to be an empty set.

6. The method of claim 4, further comprising representing said first array Arr1(m) as a binary sequence of length LN1(m)÷|LN2(m)+D1}DP1(m), where DP1(m)=×int $\{\log_2(1/DP(m))\}$.

7. A method for electronically transmitting a numeral, expressed in binary format, the method comprising:

receiving a numeral string S*, expressed in binary format as an ordered sequence of D binary digits ("bits"), that is to be transmitted electronically to a location spaced apart from where the numeral string is received;

expressing S* as a numeral string S in terms of a base $q=2^p$ where p is a positive integer, a negative integer or zero;

expressing a magnitude M(S) of the numeral string S in at least one of the formats $$M1(S)=2^{b1}f_1(S)=2^{b1}\{1,a_1,a_2\ldots a_n\},$$

and $$M2(S)=2^{b1+1}f_2(S)=2^{b1+1}\{0.1\ a'_1 a'_2 \ldots, a'_N\},$$

where $1 \leq f_1(S) < 2$ and $0.5 \leq f_2(S) < 1$, and $a'_n$ are binary numerals (0 or 1) satisfying $a_n = a'_{n+1}$ )n=1, . . . , N), and satisfying $a_1 a'_{a+1} = 0 (n \leq N)$, and where a magnitude exponent b1 is chosen from among a set of integers including b1=pm+r, with a base exponent $p \geq 5$ and m=0, 1, 2, 3, 4, . . . , p−1 and $0 \leq r \leq p-1$;

where the magnitude of S can be expressed in the format M1(S), with base exponent p, and m in the format M2(S), with base exponent p−1, for each of m=0, . . . , p1r=m, m+1, . . . , p−1, transmitting the magnitude of S in the format M1(S); and where the magnitude of S can be expressed in the format M1(S), with base exponent p, and in the format M2(S), with base exponent p+1, and m and r do not simultaneously satisfy m=0, . . . , p−1 and r=m,m+1 . . . p−1, transmitting the magnitude of S in the format M1(S) or M2(S).

8. The method of claim 7, further comprising:

receiving a numeral string S1, expressed in decimal format as an ordered sequence of D* decimal digits;

converting the numeral string S1 to a binary format numeral S2, where S2 is expressed as an ordered sequence of D bits, and where D=−int{log(1/D*)}, and providing S2 as said numeral string S* expressed in binary format.

9. The method of claim 7, further comprising:

choosing said base exponent p=5;

transmitting said magnitude of S in said format M1(S), where said magnitude exponent b1 satisfies b1=00, 01, 02, 03, 04, 06, 07, 08, 09, 12, 13, 14, 18, 19, or 24; and transmitting said magnitude of S in said format M1(S) or M2(S), where said magnitude exponent b1 is not one of the integers 00, 01, 02, 03, 04, 06, 07, 08, 09, 12, 13, 14, 18, 19, or 24.

10. The method of claim 7, further comprising:

choosing said base exponent p=6;

transmitting said magnitude of S in said format M1(S), where said magnitude exponent b1 satisfies b1=00, 01, 02, 03, 04, 06, 07, 08, 09, 10, 14, 15, 16, 17, 21, 22, 23, 28, 29 or 35; and transmitting said magnitude of S in said format M1(S) or M2(S), where said magnitude exponent b1 is not one of the integers 00, 01, 02, 03, 04, 06, 07, 08, 09, 10, 14, 15, 16, 17, 21, 22, 23, 28, 29 or 35.

11. The method of claim 7, further comprising:

choosing said base exponent p=7;

transmitting said magnitude of S in said format M1(S), where said magnitude exponent b1 satisfies b1=integers 00, 01, 02, 03, 04, 05, 06, 08, 09, 10, 11, 12, 13, 16, 17, 18, 19, 20, 24, 25, 26, 27, 32, 33, 34, 40, 41 or 48; and transmitting said magnitude of S in said format M1(S) or M2(S), where said magnitude exponent b1 is not one of the integers 00, 01, 02, 03, 04, 05, 06, 08, 09, 10, 11, 12, 13, 16, 17, 18, 19, 20, 24, 25, 26, 27, 32, 33, 34, 40, 41 or 48.

* * * * *